US012581738B2

(12) United States Patent (10) Patent No.: US 12,581,738 B2
Hyun et al. (45) Date of Patent: Mar. 17, 2026

(54) DISPLAY DEVICE AND METHOD OF MANUFACTURING THE DISPLAY DEVICE

(71) Applicant: Samsung Display Co., LTD., Yongin-si (KR)

(72) Inventors: Jin Ho Hyun, Yongin-si (KR); Woo Yong Sung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 385 days.

(21) Appl. No.: 18/192,161

(22) Filed: Mar. 29, 2023

(65) Prior Publication Data

US 2023/0326935 A1     Oct. 12, 2023

(30) Foreign Application Priority Data

Apr. 12, 2022    (KR) ........................ 10-2022-0045367

(51) Int. Cl.
| | |
|---|---|
| *H10D 86/60* | (2025.01) |
| *H01L 23/00* | (2006.01) |
| *H01L 25/16* | (2023.01) |
| *H10D 86/01* | (2025.01) |
| *H10D 86/40* | (2025.01) |
| *H10H 20/857* | (2025.01) |

(52) U.S. Cl.
CPC ............. *H10D 86/60* (2025.01); *H01L 24/05* (2013.01); *H01L 25/167* (2013.01); *H10D 86/0241* (2025.01); *H10D 86/451* (2025.01); *H10H 20/857* (2025.01); *H01L 24/06* (2013.01); *H01L 24/08* (2013.01); *H01L 24/16* (2013.01); *H01L 2224/05572* (2013.01); *H01L*

*2224/05573* (2013.01); *H01L 2224/06181* (2013.01); *H01L 2224/08145* (2013.01); *H01L 2224/16225* (2013.01); *H01L 2924/12041* (2013.01); *H10D 86/441* (2025.01)

(58) Field of Classification Search
CPC ... H01L 24/05; H01L 25/167; H01L 25/0753; H10D 86/0241; H10D 86/451; H10H 20/857

See application file for complete search history.

(56) References Cited

U.S. PATENT DOCUMENTS

| | | | | |
|---|---|---|---|---|
| 9,577,193 | B2 * | 2/2017 | Kim | ..................... G03F 7/2022 |
| 10,276,723 | B2 | 4/2019 | Youn et al. | |
| 11,244,994 | B2 * | 2/2022 | Xu | ..................... H10K 59/1275 |
| 12,336,287 | B2 | 6/2025 | Jang et al. | |
| 2015/0195915 | A1 | 7/2015 | Namkung | |

(Continued)

FOREIGN PATENT DOCUMENTS

| | | |
|---|---|---|
| KR | 10-2007-0050781 | 5/2007 |
| KR | 1020150081563 A | 7/2015 |

(Continued)

*Primary Examiner* — Jeff W Natalini
*Assistant Examiner* — Rose Keagy
(74) *Attorney, Agent, or Firm* — CANTOR COLBURN LLP

(57) ABSTRACT

The display device includes light emitting elements disposed on a first surface of a substrate, a connection electrode disposed on a second surface of the substrate, a first protective layer disposed on the connection electrode, and a second protective layer disposed on the first protective layer. A surface roughness of the second protective layer is greater than a surface roughness of the first protective layer.

20 Claims, 13 Drawing Sheets

(56)     References Cited

U.S. PATENT DOCUMENTS

2021/0202630 A1      7/2021  Jeon et al.
2022/0093677 A1*    3/2022  Jeong .................... H10H 20/857

FOREIGN PATENT DOCUMENTS

KR        1020160118467  A      10/2016
KR        1020180033385  A       4/2018
KR       10-2021-0086281             7/2021
KR        1020220021997  A       2/2022

* cited by examiner

PX                                    10

· · ·

Y
↑
→X
Z

ACT: TCH, TS, TD
GTL1: TG, CAE1
GTL2: CAE2
DTL1: CE1
DTL2: CE2, VSL

DISPLAY DEVICE AND METHOD OF MANUFACTURING THE DISPLAY DEVICE

CROSS-REFERENCE TO RELATED APPLICATION(S)

This application claims priority to and benefit of Korean patent application No. 10-2022-0045367 under 35 U.S.C. § 119(a), filed on Apr. 12, 2022, in the Korean Intellectual Property Office (KIPO), the contents of which are incorporated by reference in its entirety.

BACKGROUND

1. Technical Field

The disclosure generally relates to a display device and a method of manufacturing the display device.

2. Description of Related Art

Recently, as interest in information displays is increased, research and development of display devices have been continuously conducted.

SUMMARY

Embodiments provide a display device and a method of manufacturing the display device, which can reduce a stain and a thickness distribution of a protective film.

In accordance with an aspect of the present disclosure, a display device may include light emitting elements disposed on a first surface of a substrate, a connection electrode disposed on a second surface of the substrate, a first protective layer disposed on the connection electrode, and a second protective layer disposed on the first protective layer. A surface roughness of the second protective layer may be greater than a surface roughness of the first protective layer.

An oxygen (O) content of the second protective layer may be greater than an oxygen (O) content of the first protective layer.

The first protective layer may include silicon nitride $(SiN_x)$.

The second protective layer may include silicon oxide $(SiO_x)$.

The second protective layer may include silicon oxynitride $(SiO_xN_y)$.

A thickness of the second protective layer may be less than a thickness of the first protective layer.

The display device may further include a via layer disposed between the connection electrode and the first protective layer.

A thickness of the via layer may be greater than a thickness of the first protective layer.

The display device may further include at least one transistor disposed on the first surface of the substrate.

The display device may further include electrodes electrically connecting the at least one transistor and the light emitting elements to each other.

In accordance with another aspect of the disclosure, a method of manufacturing a display device may include forming a front pattern on a first surface of a substrate; forming a rear pattern on a second surface of the substrate, forming a first protective layer on the rear patter, forming a second protective layer on the first protective layer, and forming a protective film on the second protective layer. A surface roughness of the second protective layer may be greater than a surface roughness of the first protective layer.

The method may further include forming a front protective layer on the front pattern.

The method may further include etching the front protective layer after the forming of the protective film.

The method may further include removing the protective film after the etching of the front protective layer.

The method may further include forming a protective film layer on the second protective layer. The forming of the protective film may include curing the protective film layer.

The protective film layer may be formed by an inkjet printing.

The second protective layer may be thinner than the first protective layer.

The first protective layer may include silicon nitride $(SiN_x)$.

The second protective layer may include silicon oxide $(SiO_x)$.

The second protective layer may include silicon oxynitride $(SiO_xN_y)$.

In accordance with the disclosure, a second protective layer having a high surface roughness is formed on a rear surface of a substrate, to which a protective film is attached, so that a stain and a thickness distribution of the protective film can be reduced, thereby improving processibility.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
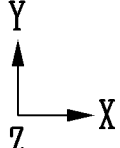
FIG. 1 is a plan view illustrating a display device in accordance with an embodiment of the disclosure.

The effects and characteristics of the disclosure and a method of achieving the effects and characteristics will be clear by referring to the embodiments described below in detail together with the accompanying drawings. However, the disclosure is not limited to the embodiments disclosed herein but may be implemented in various forms. The embodiments are provided by way of example only so that a person of ordinary skilled in the art can fully understand the features in the disclosure and the scope thereof. Therefore, the disclosure can be defined by the scope of the appended claims.

The terminology used herein is for the purpose of describing particular embodiments only and is not construed as limiting. As used herein, the singular forms are intended to include the plural forms as well, unless the context clearly indicates otherwise. The terms "comprises/includes" and/or "comprising/including," when used in this specification, specify the presence of mentioned component, step, operation and/or element, but do not exclude the presence or addition of one or more other components, steps, operations and/or elements.

When described as that any element is "connected", "coupled" or "accessed" to another element, it should be understood that it is possible that still another element may "connected", "coupled" or "accessed" between the two elements as well as that the two elements are directly "connected", "coupled" or "accessed" to each other.

It will be understood that when an element such as a layer, film, region, or substrate is referred to as being "on" or "over" another element, it can be directly on the other element or intervening element(s) may also be present. In contrast, when an element is referred to as being "directly on" another element, no intervening elements are present. Like reference numerals generally denote like elements throughout the specification.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in more detail with reference to the accompanying drawings.

Figure 2:
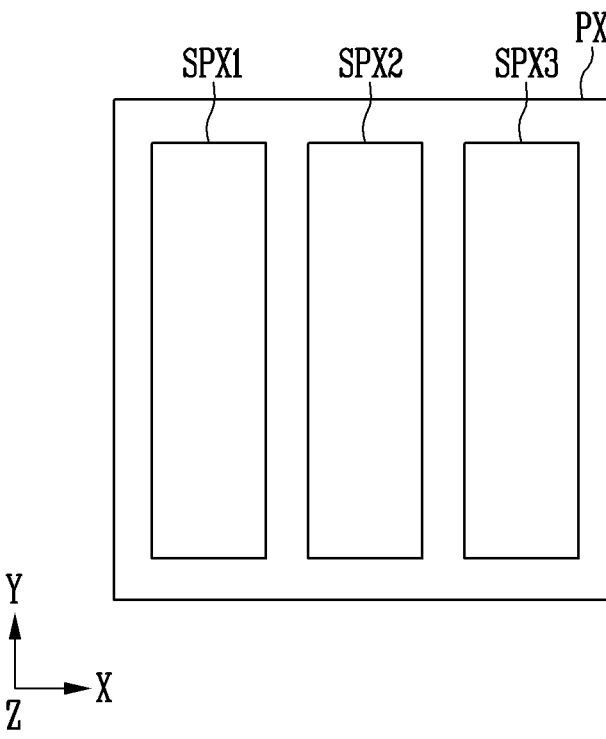
FIGS. 2 and 3 are plan views illustrating a pixel shown in FIG. 1.
Figure 3:
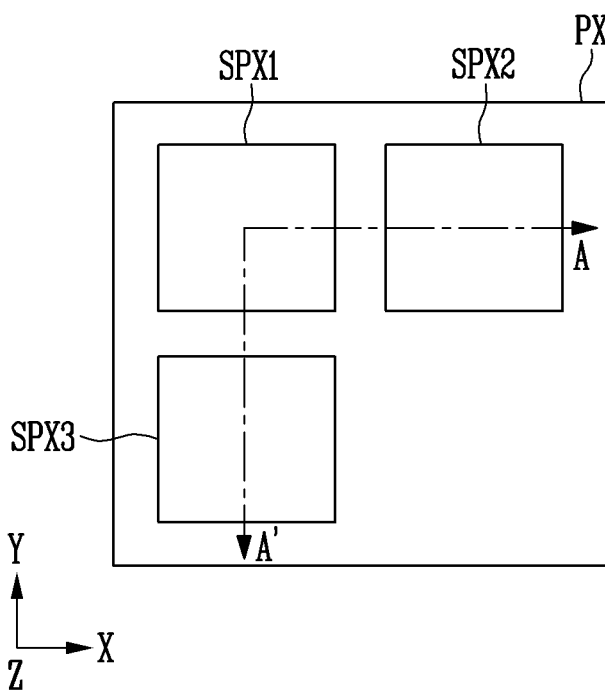

FIG. 1 is a plan view illustrating a display device in accordance with an embodiment of the disclosure. FIGS. 2 and 3 are plan views illustrating a pixel shown in FIG. 1.

Referring to FIG. 1, the display device 10 may be a device for displaying a moving image or a still image, and may be used as a display screen of portable electronic devices such as a mobile phone, a smart phone, a tablet personal computer (PC), a smart watch, a watch phone, a mobile communication terminal, an electronic notebook, an electronic book, a portable multimedia player (PMP), a navigation system, an ultra-mobile PC (UMPC), as well as a display screen of various products such as a television, a notebook computer, a computer monitor, a digital billboard, and Internet of Things (IoT).

The display device 10 may be formed in a planar shape of a rectangle having long sides in a first direction (X-axis direction) and short sides in a second direction (Y-axis direction) intersecting the first direction (X-axis direction). A corner at which a long side in the first direction (X-axis direction) and a short side in the second direction (Y-axis direction) meet each other may be formed round to have a predetermined (or selectable) curvature or be formed at a right angle. The planar shape of the display device 10 is not limited to a quadrangular shape, and may be formed in another polygonal shape, a circular shape, or an elliptical shape. The display device 10 may be formed flat, but the disclosure is not limited thereto. For example, the display device 10 may include a curved part which is formed at a left/right end, and has a constant curvature or a changing curvature. The display device 10 may be formed flexible to be curvable, warpable, bendable, foldable, or rollable.

In order to display an image, the display device 10 may include pixels PX, scan lines extending in the first direction (X-axis direction), and data lines extending in the second direction (Y-axis direction). The pixels PX may be arranged in a matrix form in the first direction (X-axis direction) and the second direction (Y-axis direction).

Each of the pixels PX may include multiple sub-pixels SPX1, SPX2, and SPX3 as shown in FIGS. 2 and 3. Although a case where each of the pixels PX includes three sub-pixels SPX1, SPX2, and SPX3, i.e., a first sub-pixel SPX1, a second sub-pixel SPX2, and a third sub-pixel SPX3 is illustrated in FIGS. 2 and 3, the disclosure is not necessarily limited thereto.

Each of the first sub-pixel SPX1, the second sub-pixel SPX2, and the third sub-pixel SPX3 may be electrically connected to at least one data line among the data lines and at least one scan line among the scan lines.

Each of the first sub-pixel SPX1, the second sub-pixel SPX2, and the third sub-pixel SPX3 may have a planar shape of a rectangle, a square, or a rhombus. For example, each of the first sub-pixel SPX1, the second sub-pixel SPX2, and the third sub-pixel SPX3 may have a planar shape of a rectangle having short sides in the first direction (X-axis direction) and long sides in the second direction (Y-axis direction) as shown in FIG. 2. In another embodiment, each of the first sub-pixel SPX1, the second sub-pixel SPX2, and the third sub-pixel SPX3 may have a planar shape of a square or a rhombus, which includes sides having the same length in the first direction (X-axis direction) and the second direction (Y-axis direction) as shown in FIG. 3.

As shown in FIG. 2, the first sub-pixel SPX1, the second sub-pixel SPX2, and the third sub-pixel SPX3 may be arranged in the first direction (X-axis direction). In another embodiment, one of the second sub-pixel SPX2 and the third sub-pixel SPX3 and the first sub-pixel SPX1 may be arranged in the first direction (X-axis direction), and another one of the second sub-pixel SPX2 and the third sub-pixel SPX3 and the first sub-pixel SPX1 may be arranged in the second direction (Y-axis direction). For example, as shown in FIG. 3, the first sub-pixel SPX1 and the second sub-pixel SPX2 may be arranged in the first direction (X-axis direction), and the first sub-pixel SPX1 and the third sub-pixel SPX3 may be arranged in the second direction (Y-axis direction).

In another embodiment, one of the first sub-pixel SPX1 and the third sub-pixel SPX3 and the second sub-pixel SPX2 may be arranged in the first direction (X-axis direction), and another one of the first sub-pixel SPX1 and the third sub-pixel SPX3 and the second sub-pixel SPX2 may be arranged in the second direction (Y-axis direction). In another embodiment, one of the first sub-pixel SPX1 and the second sub-pixel SPX2 and the third sub-pixel SPX3 may be arranged in the first direction (X-axis direction), and another one of the first sub-pixel SPX1 and the second sub-pixel SPX2 and the third sub-pixel SPX3 may be arranged in the second direction (Y-axis direction).

The first sub-pixel SPX1 may emit first light, the second sub-pixel SPX2 may emit second light, and the third sub-pixel SPX3 may emit third light. The first light may be light in a red wavelength band, the second light may be light in a green wavelength band, and the third light may be light in a blue wavelength band. The red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm. However, the disclosure is not necessarily limited thereto.

Each of the first sub-pixel SPX1, the second sub-pixel SPX2, and the third sub-pixel SPX3 may include a light emitting element emitting light, and may include an inorganic light emitting element having an inorganic semiconductor. For example, the inorganic light emitting element may be a flip chip type light emitting diode (LED), but the disclosure is not necessarily limited thereto.

As shown in FIGS. 2 and 3, an area of the first sub-pixel SPX1, an area of the second sub-pixel SPX2, and an area of the third sub-pixel SPX3 may be substantially the same, but the disclosure is not necessarily limited thereto. At least one of the area of the first sub-pixel SPX1, the area of the second sub-pixel SPX2, and the area of the third sub-pixel SPX3 may be different from area of another sub-pixel. In another embodiment, two of the area of the first sub-pixel SPX1, the area of the second sub-pixel SPX2, and the area of the third sub-pixel SPX3 may be substantially the same, and the other may be different from the two. In another embodiment, the area of the first sub-pixel SPX1, the area of the second sub-pixel SPX2, and the area of the third sub-pixel SPX3 may be different from one another.

Figure 4:
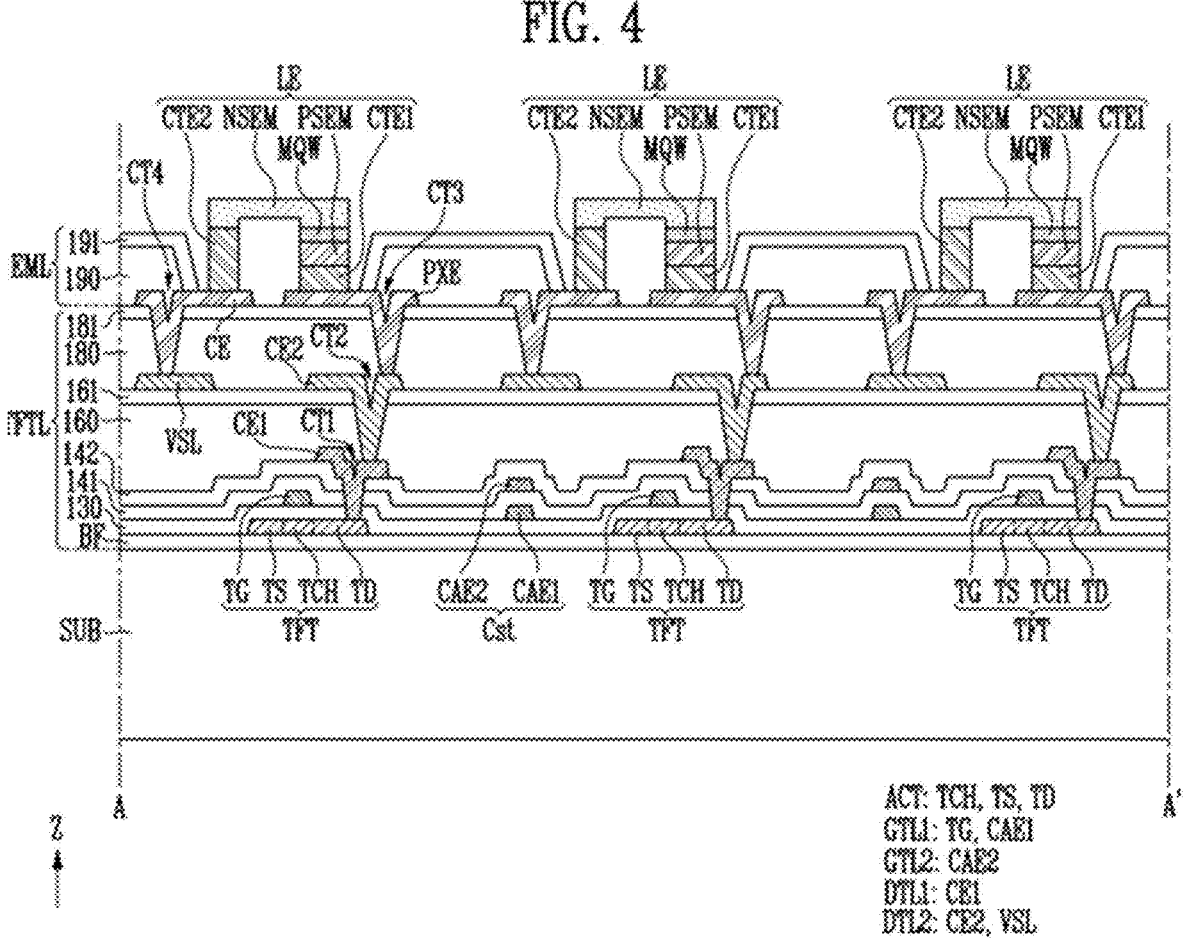
FIG. 4 is a schematic cross-sectional view taken along line A-A' shown in FIG. 3.

FIG. 4 is a schematic cross-sectional view taken along line A-A' shown in FIG. 3.

Referring to FIG. 4, a thin film transistor layer TFTL may be disposed on a substrate SUB. The thin film transistor layer TFTL may be a layer in which a thin film transistor TFT is formed.

The thin film transistor layer TFTL may include an active layer, a first gate layer GTL1, a second gate layer GTL2, a first data metal layer DTL1, and a second data metal layer DTL2.

Also, the thin film transistor layer TFTL may include a buffer layer BF, a gate insulating layer 130, a first interlayer insulating layer 141, a second interlayer insulating layer 142, a first planarization layer 160, a first insulating layer 161, a second planarization layer 180, and a second insulating layer 181.

The substrate SUB may be a base substrate or a base member, which is used to support the display device 10. The substrate SUB may be a rigid substrate including glass. In another embodiment, the substrate SUB may be a flexible substrate to be bendable, foldable, rollable, and the like. The substrate SUB may include an insulating material including a polymer resin such as polyimide (PI).

The buffer layer BF may be disposed on a surface of the substrate SUB. The buffer layer BF may be a layer for preventing infiltration of air or moisture. The buffer layer BF may include multiple inorganic layers which are alternately stacked each other. For example, the buffer layer BF may be formed as a multi-layer in which inorganic layers including at least one of silicon nitride ($SiN_x$), silicon oxynitride ($SiO_xN_y$), silicon oxide ($SiO_x$), titanium oxide ($TiO_x$), and aluminum oxide ($AlO_x$) are alternately stacked each other. In some embodiments, the buffer layer BF may be omitted.

The active layer ACT may be disposed on the buffer layer BF. The active layer ACT may include a silicon semiconductor such as polycrystalline silicon, single crystalline silicon, low polycrystalline silicon, and/or amorphous silicon, or include an oxide semiconductor.

The active layer ACT may include a channel TCH, a first electrode TS, and a second TD of the thin film transistor TFT. The channel TCH of the thin film transistor TFT may be a region overlapping a gate electrode TG of the thin film transistor TFT in a third direction (Z-axis direction) as a thickness direction of the substrate SUB. The first electrode TS of the thin film transistor TFT may be disposed on a side of the channel TCH, and the second electrode TD of the thin film transistor TFT may be disposed on another side of the channel TCH. The first electrode TS and the second electrode TD of the thin film transistor TFT may be regions not overlapping the gate electrode TG in the third direction (Z-axis direction). The first electrode TS and the second electrode TD of the thin film transistor TFT may be regions in which ions are doped in a silicon semiconductor or an oxide semiconductor, to have conductivity.

The gate insulating layer 130 may be disposed over the active layer ACT. The gate insulating layer 30 may be formed as an inorganic layer including silicon nitride ($SiN_x$), silicon oxynitride ($SiO_xN_y$), silicon oxide ($SiO_x$), titanium oxide ($TiO_x$), or aluminum oxide ($AlO_x$).

The first gate layer GTL1 may be disposed on the gate insulating layer 130. The first gate layer GTL1 may include the gate electrode TG of the thin film transistor TFT and a first capacitor electrode CAE1. The first gate layer GTL1 may be formed as a single layer or a multi-layer, which includes at least one of molybdenum (Mo), aluminum (Al), chromium (Cr), gold (Au), titanium (Ti), nickel (Ni), neodymium (Nd), and copper (Cu), or any alloy thereof.

The first interlayer insulating layer 141 may be disposed over the first gate layer GTL1. The first interlayer insulating layer 141 may be formed as an inorganic layer including silicon nitride ($SiN_x$), silicon oxynitride ($SiO_xN_y$), silicon oxide ($SiO_x$), titanium oxide ($TiO_x$), or aluminum oxide ($AlO_x$).

The second gate layer GTL2 may be disposed on the first interlayer insulating layer 141. The second gate layer GTL2 may include a second capacitor electrode CAE2. The second gate layer GTL2 may be formed as a single layer or a multi-layer, which includes at least one of molybdenum (Mo), aluminum (Al), chromium (Cr), gold (Au), titanium (Ti), nickel (Ni), neodymium (Nd), and copper (Cu), or any alloy thereof.

The second interlayer insulating layer 142 may be disposed over the second gate layer GTL2. The second interlayer insulating layer 142 may be formed as an inorganic layer including silicon nitride ($SiN_x$), silicon oxynitride ($SiO_xN_y$), silicon oxide ($SiO_x$), titanium oxide ($TiO_x$), or aluminum oxide ($AlO_x$).

The first data metal layer DTL1 including a first connection electrode CE1 may be disposed on the second interlayer insulating layer 142. The first data metal layer DTL1 may be formed as a single layer or a multi-layer, which includes at least one of molybdenum (Mo), aluminum (Al), chromium (Cr), gold (Au), titanium (Ti), nickel (Ni), neodymium (Nd), and copper (Cu), or any alloy thereof.

The first connection electrode CE1 may be electrically connected to the first electrode TS or the second electrode TD of the thin film transistor TFT through a first contact hole CT1 penetrating the gate insulating layer 130, the first interlayer insulating layer 141, and/or the second interlayer insulating layer 142.

The first planarization layer 160 for planarizing a step difference due to the active layer ACT, the first gate layer GTL1, the second gate layer GTL2, and/or the first data metal layer DTL1 may be formed over the first data metal layer DTL1. The first planarization layer 160 may be formed as an organic layer including acrylic resin, epoxy resin, phenolic resin, polyamide resin, or polyimide resin.

The first insulating layer 161 may be disposed on the first planarization layer 160. The first insulating layer 161 may be formed as an inorganic layer including silicon nitride ($SiN_x$), silicon oxynitride ($SiO_xN_y$), silicon oxide ($SiO_x$), titanium oxide ($TiO_x$), or aluminum oxide ($AlO_x$).

The second data metal layer DTL2 may be formed on the first insulating layer 161. The second data metal layer DTL2 may include a second connection electrode CE2 and a first power line VSL. The second connection electrode CE2 may be electrically connected to the first connection electrode CE1 through a second contact hole CT2 penetrating the first insulating layer 161 and the first planarization layer 160. The second data metal layer DTL2 may be formed as a single layer or a multi-layer, which includes at least one of molybdenum (Mo), aluminum (Al), chromium (Cr), gold (Au), titanium (Ti), nickel (Ni), neodymium (Nd), and copper (Cu), or any alloy thereof.

The second planarization layer 180 for planarizing a step difference may be formed over the second data metal layer DTL2. The second planarization layer 180 may be formed as an organic layer including acrylic resin, epoxy resin, phenolic resin, polyamide resin, or polyimide resin.

The second insulating layer 181 may be disposed on the second planarization layer 180. The second insulating layer 181 may be formed as an inorganic layer including silicon nitride ($SiN_x$), silicon oxynitride ($SiO_xN_y$), silicon oxide ($SiO_x$), titanium oxide ($TiO_x$), or aluminum oxide ($AlO_x$).

A light emitting element layer EML may be disposed on the second insulating layer 181. The light emitting element layer EML may include pixel electrodes PXE, common electrodes CE, and light emitting elements LE. Each of the first sub-pixel SPX1, the second sub-pixel SPX2, and the third sub-pixel SPX3 may include a light emitting element LE electrically connected to a pixel electrode PXE and a common electrode CE. The pixel electrode PXE may be designated as an anode electrode, and the common electrode CE may be designated as a cathode electrode.

The pixel electrodes PXE and the common electrodes CE may be disposed on the second insulating layer 181. Each of the pixel electrodes PXE may be electrically connected to the second connection electrode CE2 through a third contact hole CT3 penetrating the second insulating layer 181 and the second planarization layer 180. Each of the pixel electrodes PXE may be electrically connected to the first electrode TS or the second electrode TD of the thin film transistor TFT through the first connection electrode CE1 and the second connection electrode CE2. Accordingly, a pixel voltage or an anode voltage, which is controlled by the thin film transistor TFT, may be applied to the pixel electrode PXE.

Each of the common electrodes CE may be electrically connected to the first power line VSL through a fourth contact hole CT4 penetrating the second insulating layer 181 and the second planarization layer 180. Accordingly, a first power voltage of the first power line VSL may be applied to each of the common electrode CE.

The pixel electrodes PXE and the common electrodes CE may include a metal material having a high reflexibility, such as a stacked structure of aluminum and titanium (Ti/Al/Ti), a stacked structure of aluminum and ITO (ITO/Al/ITO), an APC alloy, and a stacked structure of the APC alloy and ITO (ITO/APC/ITO). The APC alloy may be an alloy of silver (Ag), palladium (Pd), and copper (Cu).

In FIG. 4, it is illustrated that each of the light emitting elements LE is a flip chip type micro LED in which a first contact electrode CTE1 and a second contact electrode CTE2 face a pixel electrode PXE and a common electrode CE. The light emitting element LE may be formed of an inorganic material such as GaN. Each of a length of the light emitting element LE in the first direction (X-axis direction), a length of the light emitting element LE in the second direction (Y-axis direction), and a length of the light emitting element LE in the third direction (Z-axis direction) may be a few tens to a few hundreds of micrometers. For example, each of the length of the light emitting element LE in the first direction (X-axis direction), the length of the light emitting element LE in the second direction (Y-axis direction), and the length of the light emitting element LE in the third direction (Z-axis direction) may be about 100 μm or less.

Each of the light emitting elements LE may have a light emitting structure including an n-type semiconductor NSEM, an active layer MQW, a p-type semiconductor PSEM, a first contact electrode CTE1, and a second contact electrode CTE2.

A portion of the n-type semiconductor NSEM may be disposed on the active layer MQW. A portion of the n-type semiconductor NSEM may be disposed on the second contact electrode CTE2. In some embodiments, a surface of the n-type semiconductor NSEM may face a display surface. The n-type semiconductor NSEM may be GaN doped with an n-type conductive dopant such as Si, Ge or Sn.

The active layer MQW may be disposed on a portion of the surface of the n-type semiconductor NSEM. The active layer MQW may be interposed between the n-type semiconductor NSEM and the p-type semiconductor PSEM. The active layer MQW may include a material having a single quantum well structure or a multiple quantum well structure. In case that the active layer MQW includes a material having the multiple quantum well structure, the active layer MQW may have a structure in which multiple well layers and multiple barrier layers are alternately stacked each other. The well layer may be formed of InGaN, and the barrier layer may be formed of GaN or AlGaN. However, the disclosure is not limited thereto. In another embodiment, the active layer MQW may have a structure in which a semiconductor material having a high band gap energy and a semiconductor material having a low band gap energy are alternately stacked each other, and may include Group III to Group V semiconductor materials depending on the wavelength band of emitted light.

The p-type semiconductor PSEM may be disposed on a surface of the active layer MQW. The p-type semiconductor PSEM may be GaN doped with a p-type conductive dopant such as Mg, Zn, Ca, Sn or Ba.

The first contact electrode CTE1 may be disposed on the p-type semiconductor PSEM, and the second contact electrode CTE2 may be disposed on another portion of the surface of the n-type semiconductor NSEM. The another portion of the surface of the n-type semiconductor NSEM, on which the second electrode CTE2 is disposed, may be disposed to be spaced apart from the portion of the surface of the n-type semiconductor NSEM, on which the active layer MQW is disposed.

The first contact electrode CTE1 and the pixel electrode PXE may be adhered to each other by a conductive adhesive member such as an anisotropic conductive film (ACF) or an anisotropic conductive paste (ACP). In another embodiment, the first contact electrode CTE1 and the pixel electrode PXE may be adhered to each other by a soldering process.

A bank 190 covering an edge of the pixel electrode PXE and an edge of the common electrode CE may be disposed on the second insulating layer 181. The bank 190 may be formed as an organic layer including acrylic resin, epoxy resin, phenolic resin, polyamide resin, or polyimide resin.

A third insulating layer 191 may be disposed over the bank 190. The third insulating layer 191 may cover an edge of the pixel electrode PXE and an edge of the common electrode CE. The third insulating layer 191 may be formed as an inorganic layer including silicon nitride ($SiN_x$), silicon oxynitride ($SiO_xN_y$), silicon oxide ($SiO_x$), titanium oxide ($TiO_x$), or aluminum oxide ($AlO_x$).

Figure 5:
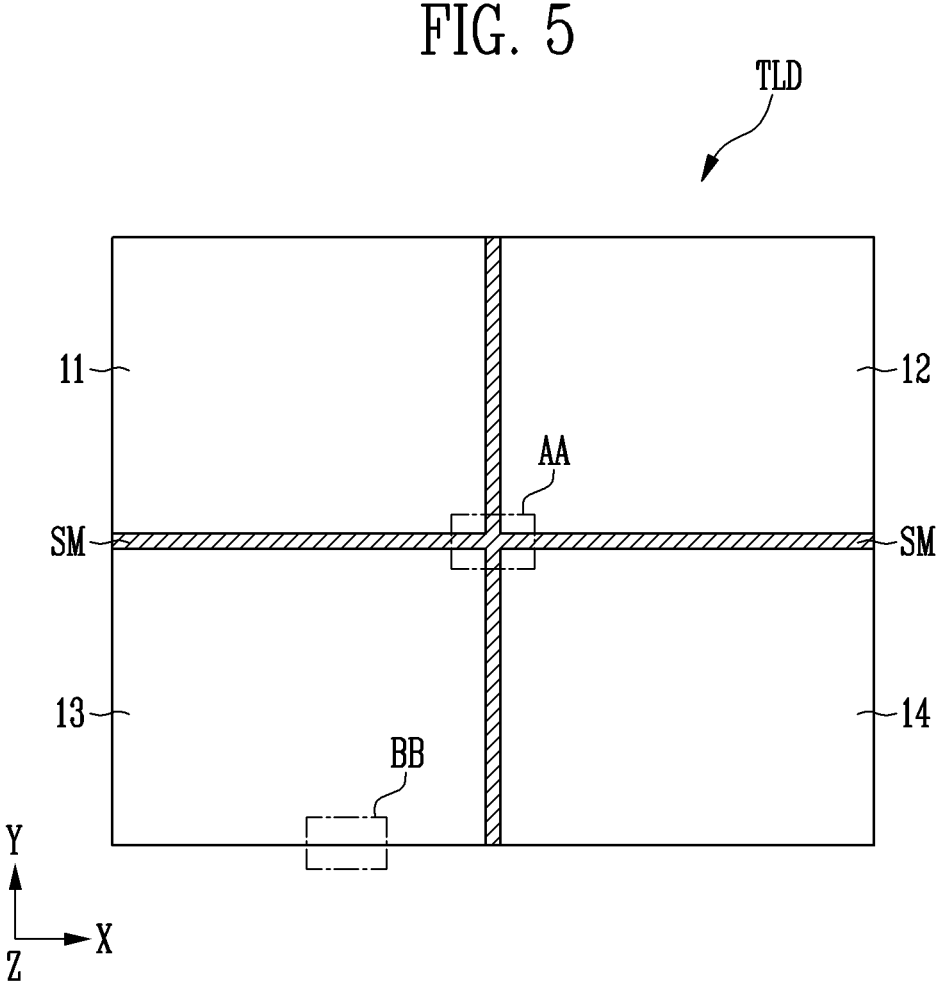
FIG. 5 is a plan view illustrating a tiled display device including multiple display devices in accordance with an embodiment of the disclosure.

FIG. 5 is a plan view illustrating a tiled display device including multiple display devices in accordance with an embodiment of the disclosure.

Referring to FIG. 5, the tiled display device TLD may include multiple display devices 11, 12, 13, and 14, and a joining part SM. For example, the tiled display device TLD may include a first display device 11, a second display device 12, a third display device 13, and a fourth display device 14.

The display devices 11, 12, 13, and 14 may be arranged in a lattice form. The display devices 11, 12, 13, and 14 may be arranged in a matrix form on M (M is a positive integer) rows and N (N is a positive integer) columns. For example, the first display device 11 and the second display device 12 may be adjacent to each other in the first direction (X-axis direction). The first display device 11 and the third display device 13 may be adjacent to each other in the second direction (Y-axis direction). The third display device 13 and the fourth display device 14 may be adjacent to each other in the first direction (X-axis direction). The second display device 12 and the fourth display device 14 may be adjacent to each other in the second direction (Y-axis direction).

However, the number and arrangement of the display devices 11, 12, 13, and 14 in the tiled display device TLD are not limited to those shown in FIG. 5. The number and arrangement of the display devices 11, 12, 13, and 14 in the tiled display device TLD may be determined according to a size of each of the display device 10 and the tiled display device TLD and a shape of the tiled display device TLD.

The display devices 11, 12, 13, and 14 may have the same size, but the disclosure is not necessarily limited thereto. For example, in some embodiments, the display devices 11, 12, 13, and 14 may have different sizes.

Each of the display devices 11, 12, 13, and 14 may have a rectangular shape including long sides and short sides. The display devices 11, 12, 13, and 14 may be disposed such that long sides or short sides are connected to each other. Some or all of the display devices 11, 12, 13, and 14 may be disposed at an edge of the tiled display device TLD, and may form one side of the tiled display device TLD. At least one display device among the display devices 11, 12, 13, and 14 may be disposed at at least one corner of the tiled display device TLD, and may form two adjacent sides of the tiled display device TLD. At least one display device among the display devices 11, 12, 13, and 14 may be surrounded by other display devices.

Each of the display devices 11, 12, 13, and 14 may be substantially identical to the display device 10 described in conjunction with FIGS. 1 to 4. Therefore, descriptions of each of the display devices 11, 12, 13, and 14 will be omitted.

The joining part SM may include a coupling member or an adhesive member. The display devices 11, 12, 13, and 14 may be connected to each other by the coupling member or the adhesive member of the joining part SM. The joining part SM may be disposed between the first display device 11 and the second display device 12, between the first display device 11 and the third display device 13, between the second display device 12 and the fourth display device 14, and between the third display device 13 and the fourth display device 14.

Figure 6:
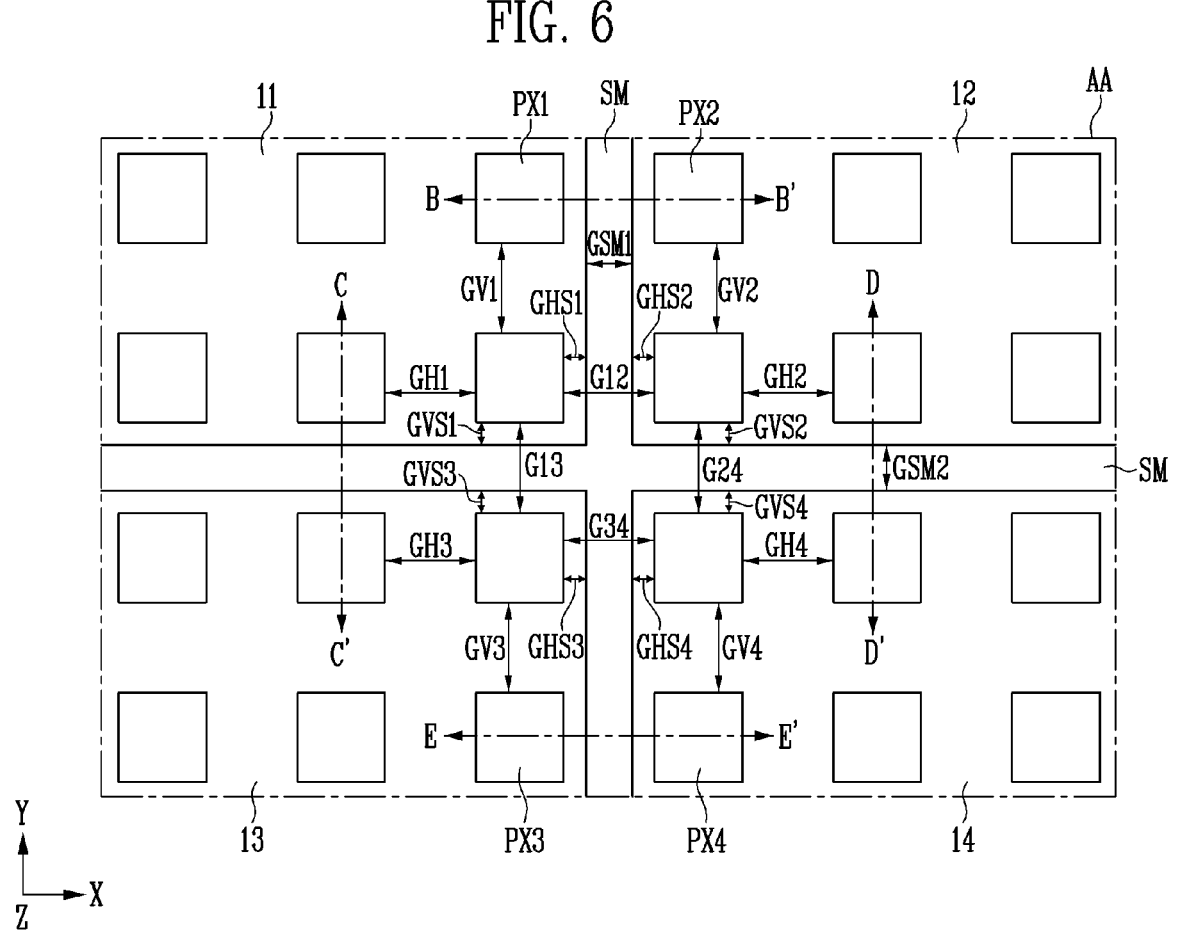
FIG. 6 is an enlarged view of area AA shown in FIG. 5.

FIG. 6 is an enlarged view of area AA shown in FIG. 5.

Referring to FIG. 6, the joining part SM may have a planar shape of a cross or plus sign in a central area of the tiled display device TLD, in which the first display device 11, the second display device 12, the third display device 13, and the fourth display device 14 are adjacent to each other. The joining part SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form in the first direction (X-axis direction) and the second direction (Y-axis direction) to display an image. The second display device 12 may include second pixels PX2 arranged in a matrix form in the first direction (X-axis direction) and the second direction (Y-axis direction) to display an image. The third display device 13 may include third pixels PX3 arranged in a matrix form in the first direction (X-axis direction) and the second direction (Y-axis direction) to display an image. The fourth display device 14 may include fourth pixels PX4 arranged in a matrix form in the first direction (X-axis direction) and the second direction (Y-axis direction) to display an image.

A minimum distance between adjacent first pixels PX1 in the first direction (X-axis direction) may be defined as a first horizontal separation distance GH1, and a minimum distance between adjacent second pixels PX2 in the first direction (X-axis direction) may be defined as a second horizontal separation distance GH2. The first horizontal separation distance GH1 and the second horizontal separation distance GH2 may be substantially the same.

The joining part SM may be disposed between a first pixel PX1 and a second pixel PX2, which are adjacent to each other in the first direction (X-axis direction). A minimum distance G12 between the first pixel PX1 and the second pixel PX2, which are adjacent to each other in the first direction (X-axis direction), may be a sum of a minimum distance GHS1 between the first pixel PX1 and the joining part SM in the first direction (X-axis direction), a minimum distance GHS2 between the second pixel PX2 and the joining part SM in the first direction (X-axis direction), and a width GSM1 of the joining part SM in the first direction (X-axis direction).

The minimum distance G12 between the first pixel PX1 and the second pixel PX2, which are adjacent to each other in the first direction (X-axis direction), the first horizontal separation distance GH1, and the second horizontal separation distance GH2 may be substantially the same. To this end, the minimum distance GHS1 between the first pixel PX1 and the joining part SM in the first direction (X-axis direction) may be smaller than the first horizontal separation distance GH1, and the minimum distance GHS2 between the second pixel PX2 and the joining part SM in the first direction (X-axis direction) may be smaller than the second horizontal separation distance GH2. The width GSM1 of the joining part SM in first direction (X-axis direction) may be smaller than the first horizontal separation distance GH1 or the second horizontal separation distance GH2.

A minimum distance between adjacent third pixels PX3 in the first direction (X-axis direction) may be defined as a third horizontal separation distance GH3, and a minimum distance between adjacent fourth pixels PX3 in the first direction (X-axis direction) may be defined as a fourth horizontal separation distance GH4. The third horizontal separation distance GH3 and the fourth horizontal separation distance GH4 may be substantially the same.

The joining part SM may be disposed between a third pixel PX3 and a fourth pixel PX4, which are adjacent to each other in the first direction (X-axis direction). A minimum distance G34 between the third pixel PX3 and the fourth pixel PX4, which are adjacent to each other in the first direction (X-axis direction), may be a sum of a minimum distance GHS3 between the third pixel PX3 and the joining part SM in the first direction (X-axis direction), a minimum distance GHS4 between the fourth pixel PX4 and the joining part SM in the first direction (X-axis direction), and the width GSM1 of the joining part SM in the first direction (X-axis direction).

The minimum distance G34 between the third pixel PX3 and the fourth pixel PX4, which are adjacent to each other in the first direction (X-axis direction), the third horizontal separation distance GH3, and the fourth horizontal separation distance GH4 may be substantially the same. To this end, the minimum distance GHS3 between the third pixel PX3 and the joining part SM in the first direction (X-axis direction) may be smaller than the third horizontal separation distance GH3, and the minimum distance GHS4 between the fourth pixel PX4 and the joining part SM in the first direction (X-axis direction) may be smaller than the fourth horizontal separation distance GH4. The width GSM1 of the joining part SM in first direction (X-axis direction) may be smaller than the third horizontal separation distance GH3 or the fourth horizontal separation distance GH4.

A minimum distance between adjacent first pixels PX1 in the second direction (Y-axis direction) may be defined as a first vertical separation distance GV1, and a minimum distance between adjacent third pixels PX3 in the second direction (Y-axis direction) may be defined as a third vertical separation distance GV3. The first vertical separation distance GV1 and the third vertical separation distance GV3 may be substantially the same.

The joining part SM may be disposed between a first pixel PX1 and a third pixel PX3, which are adjacent to each other in the second direction (Y-axis direction). A minimum distance G13 between the first pixel PX1 and the third pixel PX3, which are adjacent to each other in the second direction (Y-axis direction), may be a sum of a minimum distance GVS1 between the first pixel PX1 and the joining part SM in the second direction (Y-axis direction), a minimum distance GVS3 between the third pixel PX3 and the joining part SM in the second direction (Y-axis direction), and a width GSM2 of the joining part SM in the second direction (Y-axis direction).

The minimum distance G13 between the first pixel PX1 and the third pixel PX3, which are adjacent to each other in the second direction (Y-axis direction), the first vertical separation distance GV1, and the third vertical separation distance GV3 may be substantially the same. To this end, the minimum distance GVS1 between the first pixel PX1 and the joining part SM in the second direction (Y-axis direction) may be smaller than the first vertical separation distance GV1, and the minimum distance GVS3 between the third pixel PX3 and the joining part SM in the second direction (Y-axis direction) may be smaller than the third vertical separation distance GV3. The width GSM2 of the joining part SM in the second direction (Y-axis direction) may be smaller than the first vertical separation distance GV1 or the third vertical separation distance GV3.

A minimum distance between adjacent second pixels PX2 in the second direction (Y-axis direction) may be defined as a second vertical separation distance GV2, and a minimum distance between adjacent fourth pixels PX4 in the second direction (Y-axis direction) may be defined as a fourth vertical separation distance GV4. The second vertical separation distance GV2 and the fourth vertical separation distance GV4 may be substantially the same.

The joining part SM may be disposed between a second pixel PX2 and a fourth pixel PX4, which are adjacent to each other in the second direction (Y-axis direction). A minimum distance G24 between the second pixel PX2 and the fourth pixel PX4, which are adjacent to each other in the second direction (Y-axis direction), may be a sum of a minimum distance GVS2 between the second pixel PX2 and the joining part SM in the second direction (Y-axis direction), a minimum distance GVS4 between the fourth pixel PX4 and the joining part SM in the second direction (Y-axis direction), and the width GSM2 of the joining part SM in the second direction (Y-axis direction).

The minimum distance G24 between the second pixel PX2 and the fourth pixel PX4, which are adjacent to each other in the second direction (Y-axis direction), the second vertical separation distance GV2, and the fourth vertical separation distance GV4 may be substantially the same. To this end, the minimum distance GVS2 between the second pixel PX2 and the joining part SM in the second direction (Y-axis direction) may be smaller than the second vertical separation distance GV2, and the minimum distance GVS4 between the fourth pixel PX4 and the joining part SM in the second direction (Y-axis direction) may be smaller than the fourth vertical separation distance GV4. The width GSM2 of the joining part SM in the second direction (Y-axis direction) may be smaller than the second vertical separation distance GV2 or the fourth vertical separation distance GV4.

As shown in FIG. 6, in order to prevent the joining part SM from being viewed between images displayed by the display devices 11, 12, 13, and 14, a minimum distance between pixels of adjacent display devices may be substantially the same as a minimum distance between pixels of each of the display devices.

Figure 7:
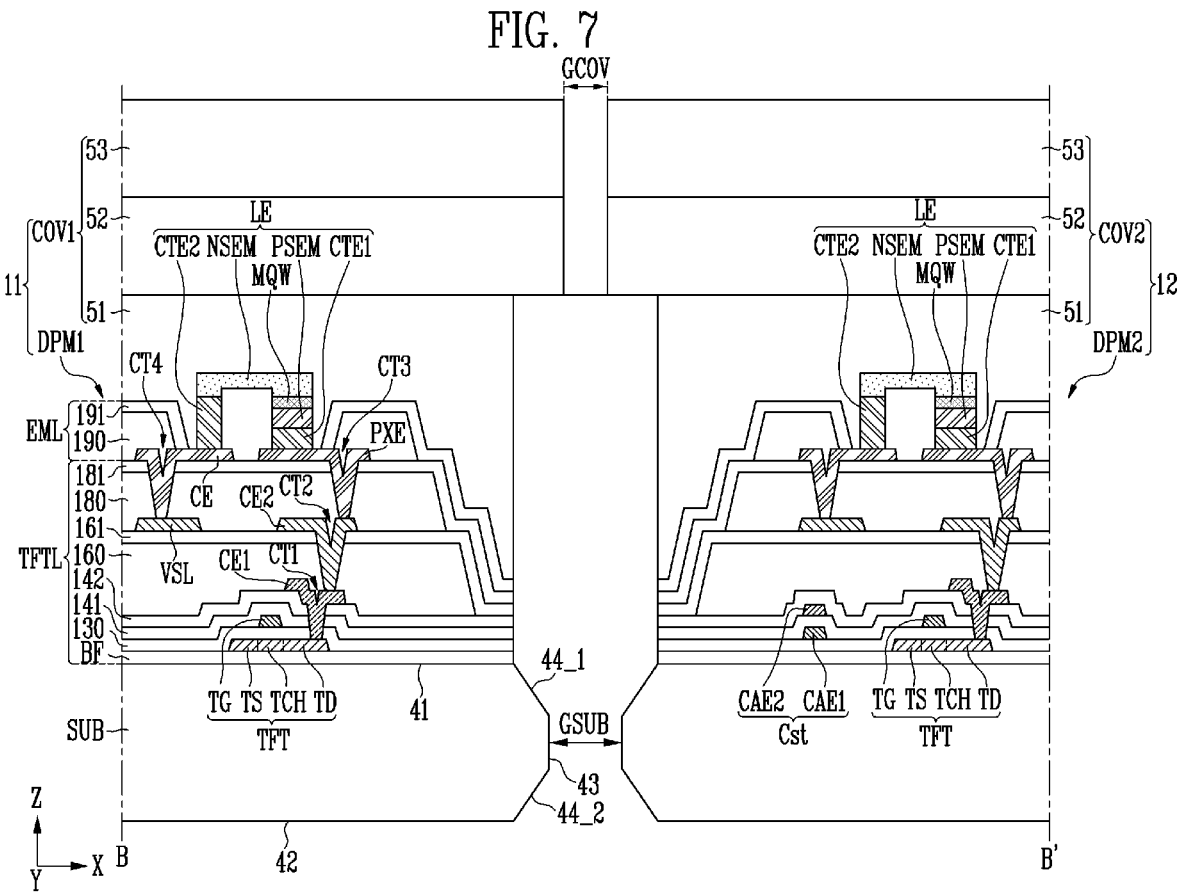
FIG. 7 is a schematic cross-sectional view taken along line B-B' shown in FIG. 6.

FIG. 7 is a schematic cross-sectional view taken along line B-B' shown in FIG. 6.

Referring to FIG. 7, the first display device 11 may include a first display module DPM1 and a first front cover COV1. The second display device 12 may include a second display module DPM2 and a second front cover COV2.

Each of the first display module DPM1 and the second display module DPM2 may include a substrate SUB, a thin film transistor layer TFTL, and a light emitting element layer EML. The thin film transistor layer TFTL and the light emitting element layer EML have been described in detail with reference to FIG. 4, and therefore, overlapping descriptions will be omitted.

The substrate SUB may include a first surface 41 on which the thin film transistor layer TFTL is disposed, a second surface 42 facing the first surface 41, and a first side surface 43 disposed between the first surface 41 and the second surface 42. The first surface 41 may be a front surface or a top surface of the substrate SUB, and the second surface 42 may be a rear surface or a bottom surface of the substrate SUB.

The substrate SUB may also include chamfered surfaces 44_1 and 44_2 disposed between the first surface 41 and the first side surface 43 and between the second surface 42 and the first side surface 43, respectively. The thin film transistor layer TFTL and the light emitting element layer EML may not be disposed on the chamfered surfaces 44_1 and 44_2. Due to the chamfered surfaces 44_1 and 44_2, the substrate SUB of the first display device 11 and a substrate SUB of the second display device 12 may be prevented from colliding with each other and being damaged.

The chamfered surfaces 44_1 and 44_2 may be disposed between the first surface and other side surfaces other than the first side surface 43 and between the second surface 42 and other side surfaces other than the first side surface 43. For example, in case that the first display device 11 and the second display device 12 have a planar shape of a rectangle as shown in FIG. 5, a chamfered surface may be disposed between the first surface 41 and each of a second side surface, a third side surface, and a fourth side surface and between the second surface 42 and each of the second side surface, the third side surface, and the fourth side surface.

The first front cover COV1 may be disposed above the chamfered surfaces 44_1 and 44_2 of the substrate SUB. For example, the first front cover COV1 may protrude over the substrate SUB in the first direction (X-axis direction) and the second direction (Y-axis direction). Therefore, a distance GSUB between the substrate SUB of the display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance adjusting layer 52 disposed on the adhesive layer 51, and an anti-glare layer 53 disposed on the light transmittance adjusting layer 52.

An adhesive member 51 of the first front cover COV1 may function to allow the light emitting element layer EML of the first display module DPM1 and the first front cover COV1 to be attached to each other. An adhesive member 51 of the second front cover COV2 may function to allow a light emitting element layer EML of the second display module DPM2 and the second front cover COV2 to be attached to each other. The adhesive member 51 may be a transparent adhesive member capable of allowing light to be transmitted therethrough. For example, the adhesive member 51 may be an optically clear adhesive film or an optically clear resin.

The anti-glare layer 53 may be designed to diffusely reflect external light to prevent deterioration of visibility of an image as the external light is reflected. Thus, the contrast ratio of an image displayed by each of the first display device 11 and the second display device 12 may become high.

The light transmittance adjusting layer 52 may be designed to decrease transmittance of external light or light reflected in the first display module DPM1 and the second display module DPM2. Therefore, the distance GSUB between the substrate SUB of the first display module DPM1 and the substrate SUB of the second display module DMP2 may be prevented from being viewed from the outside.

The anti-glare layer 53 may be implemented as a polarizing plate, and the light transmittance adjusting layer 52 may be implemented as a retardation layer. However, the disclosure is not necessarily limited thereto.

Cross-sectional structures of the tiled display device taken along lines C-C', D-D', and E-E' shown in FIG. 6 may be substantially identical to the cross-sectional structure of the tiled display device taken along the line B-B' shown in FIG. 7, and therefore, their descriptions will be omitted.

Figure 8:
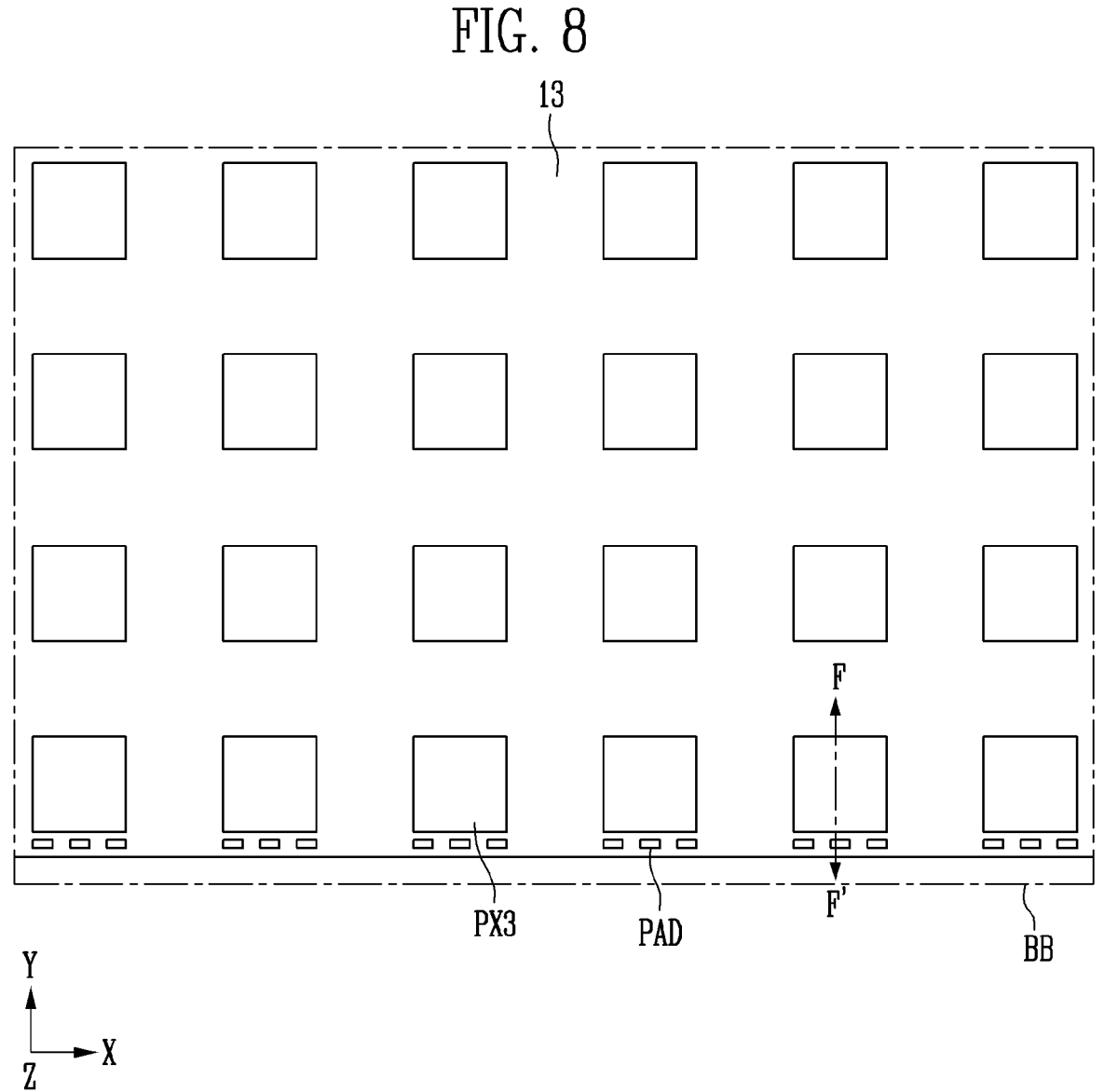
FIG. 8 is an enlarged view of area BB shown in FIG. 5.

FIG. 8 is an enlarged view of area BB shown in FIG. 5.

In FIG. 8, for convenience of description, pads PAD and third pixels PX3, which are disposed at a lower side of the third display device 13, are only illustrated. The first display device 11, the second display device 12, and the fourth display device 14 may have configurations substantially identical to a configuration of the third display device 13, and therefore, overlapping descriptions will be omitted.

Referring to FIG. 8, pads PAD may be disposed adjacent to a lower edge of the third display device 13. In case that data lines (DL shown in FIG. 9) of the third display device 13 extend in the second direction (Y-axis direction), the pads PAD may be disposed adjacent to an upper edge and a lower edge of the third display device 13. In another embodiment, in case that the data lines (DL shown in FIG. 9) of the third display device 13 extend in the first direction (X-axis direction), the pads PAD may be disposed adjacent to a left edge and a right edge of the third display device 13.

Each of the pads PAD may be electrically connected to a data line DL on a first surface 41 of a substrate SUB. Also, each of the pads PAD may be electrically connected to a side surface line SSL (shown in FIG. 9). The side surface line SSL may extend from the first surface 41 to a second surface 42 of the substrate SUB. The side surface line SSL may be electrically connected to a connection electrode (CCL shown in FIG. 9) on the second surface 42.

Figure 9:
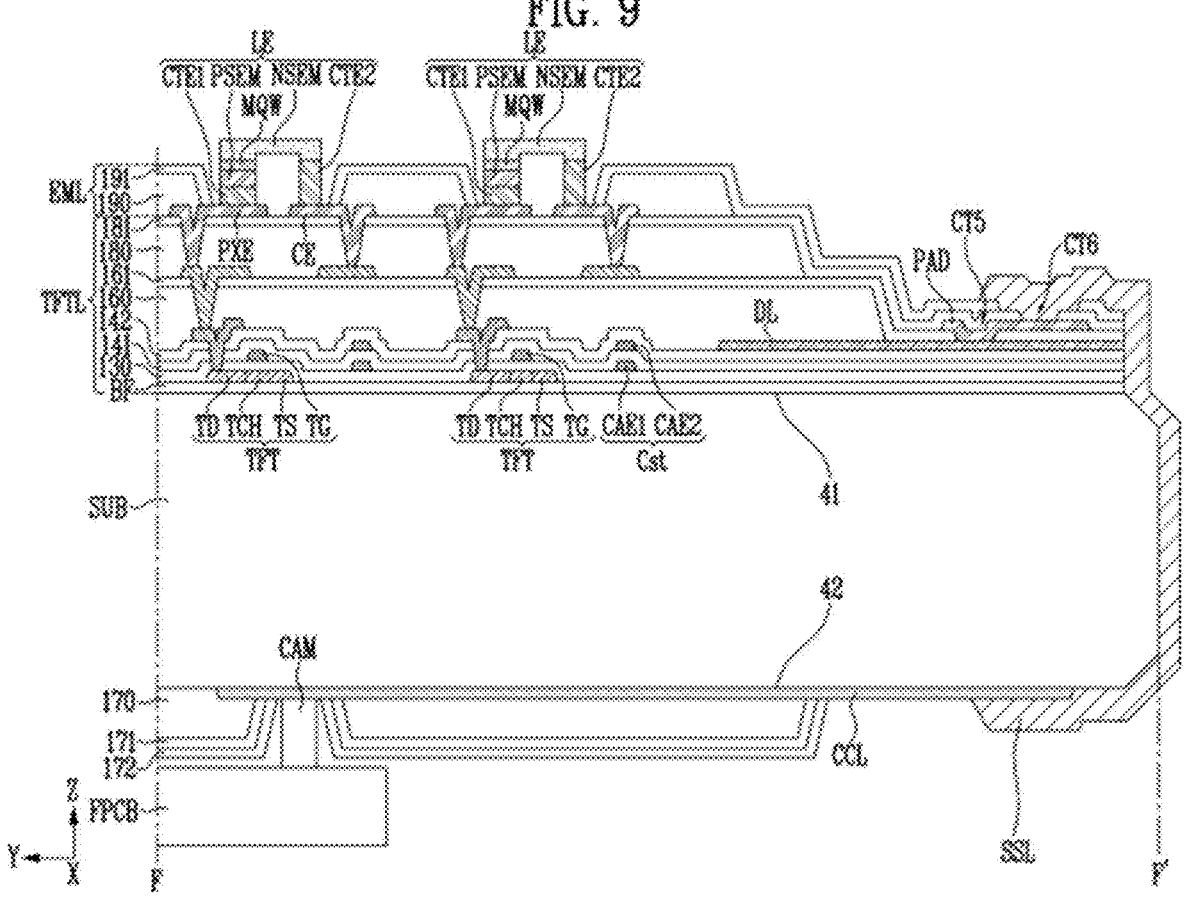
FIG. 9 is a schematic cross-sectional view taken along line F-F' shown in FIG. 8.

FIG. 9 is a schematic cross-sectional view taken along line F-F' shown in FIG. 8.

In FIG. 9, the same components as the cross-sectional view shown in FIG. 4 are designated by like reference numerals, and descriptions of portions overlapping those shown in FIG. 4 will be omitted.

Referring to FIG. 9, a pad PAD may be disposed on the first insulating layer 161. A portion of the pad PAD may be not covered by the second insulating layer 181 and the third insulating layer 191 and may be exposed. The pad PAD may include the same material as the pixel electrodes PXE and the common electrodes CE. For example, the pad PAD may include a metal material having a high reflexibility, such as a stacked structure of aluminum and titanium (Ti/Al/Ti), a stacked structure of aluminum and ITO (ITO/Al/ITO), an APC alloy, and a stacked structure of the APC alloy and ITO (ITO/APC/ITO).

The first data metal layer (DTL1 shown in FIG. 4) may include a data line DL. The data line DL may be disposed on the second interlayer insulating layer 142. For example, the data line DL and the first connection electrode CE1 may be disposed in the same layer and may include the same material.

The pad PAD may be electrically connected to the data line DL through a fifth contact hole CT5 penetrating the first planarization layer 160, the first insulating layer 161, the second planarization layer 180, and/or the second insulating layer 181.

A connection electrode CCL may be disposed on the second surface 42 of the substrate SUB. The connection electrode CCL may be formed as a single layer or a multi-layer, which include at least one of molybdenum (Mo), aluminum (Al), chromium (Cr), gold (Au), titanium (Ti), nickel (Ni), neodymium (Nd), and copper (Cu), or any alloy thereof.

A via layer 170 may be disposed on the connection electrode CCL. The via layer 170 may partially expose an end and another end of the connection electrode CCL. The via layer 170 may be formed as an organic layer including acrylic resin, epoxy resin, phenolic resin, polyamide resin, or polyimide resin.

A first protective layer 171 may be disposed on the via layer 170. A second protective layer 172 may be disposed on the first protective layer 171. Each of the first protective layer 171 and the second protective layer 172 may be formed as an inorganic layer. The first protective layer 171 and the second protective layer 172 may include different materials. For example, an oxygen (O) content of the second protective layer 172 may be greater than an oxygen (O) content of the first protective layer 171. Accordingly, a surface roughness of the second protective layer 172 may be greater than a surface roughness of the first protective layer 171. The second protective layer 172 may be a surface to which a protective film (PF shown in FIG. 16) formed on the second surface 42 of the substrate SUB is directly attached. Therefore, since the surface roughness of the second protective layer 172 is high, a spreadability of a protective film layer (PFL shown in FIG. 15) for forming the protective film (PF shown in FIG. 16) may be improved, so that a stain and a thickness distribution of the protective film (PF shown in FIG. 16) may be reduced. In an embodiment, the first protective layer 171 may include silicon nitride ($SiN_x$), and the second protective layer 172 may include silicon oxide ($SiO_x$) and/or silicon oxynitride ($SiO_xN_y$). However, the disclosure is not necessarily limited thereto, and the second protective layer 172 may be variously changed within a range in which the surface roughness of the second protective layer 172 may be increased by increasing the oxygen (O) content in the second protective layer 172.

In some embodiments, a thickness of the first protective layer 171 may be greater than a thickness of the second protective layer 172. For example, the thickness of the first protective layer 171 may be about 3000 Å, and the thickness of the second protective layer 172 may be in a range of about 100 Å to about 3000 Å. However, the disclosure is not necessarily limited thereto.

A thickness of the via layer 170 may be greater than the thickness of the first protective layer 171. For example, the thickness of the via layer 170 may be about 20000 Å, but the disclosure is not necessarily limited thereto.

An end of the side surface line SSL may be electrically connected to the pad PAD. The end of the side surface line SSL may be electrically connected to the pad PAD through a sixth contact hole CT6 penetrating the third insulating layer 191 and/or the second insulating layer 181. Another end of the side surface line SSL may be electrically connected to the connection electrode CCL exposed by the via layer 170. Accordingly, the side surface line SSL may electrically connect the pad PAD formed on the first surface 41 of the substrate SUB to the connection electrode CCL formed on the second surface 42 of the substrate SUB.

A flexible film FPCB may be disposed on the second surface 42 of the substrate SUB. The flexible film FPCB may be electrically connected to the connection electrode CCL exposed by the via layer 170, the first protective layer 171, and/or the second protective layer 172 by using a conductive adhesive member CAM.

A source driving circuit for supplying data voltages to the data lines DL may be disposed on a bottom surface of the flexible film FPCB. The conductive adhesive member CAM may be an anisotropic conductive film or an anisotropic conductive paste.

As shown in FIGS. 8 and 9, in the third display device 13, the source driving circuit of the flexible film FPCB disposed on the bottom of the substrate SUB may be electrically connected to the data line DL through the connection electrode CCL, the side surface line SSL, and the pad PAD. For example, the source driving circuit may be disposed on the substrate SUB, so that a non-display area NDA may be removed. Accordingly, pixels PX may be formed even at an edge of the substrate SUB.

In accordance with the above-described embodiment, the second protective layer 172 having a high surface roughness may be formed on the rear surface of the substrate SUB, to which the protective film is attached, so that the stain and the thickness distribution of the protective film can be reduced.

Figure 10:
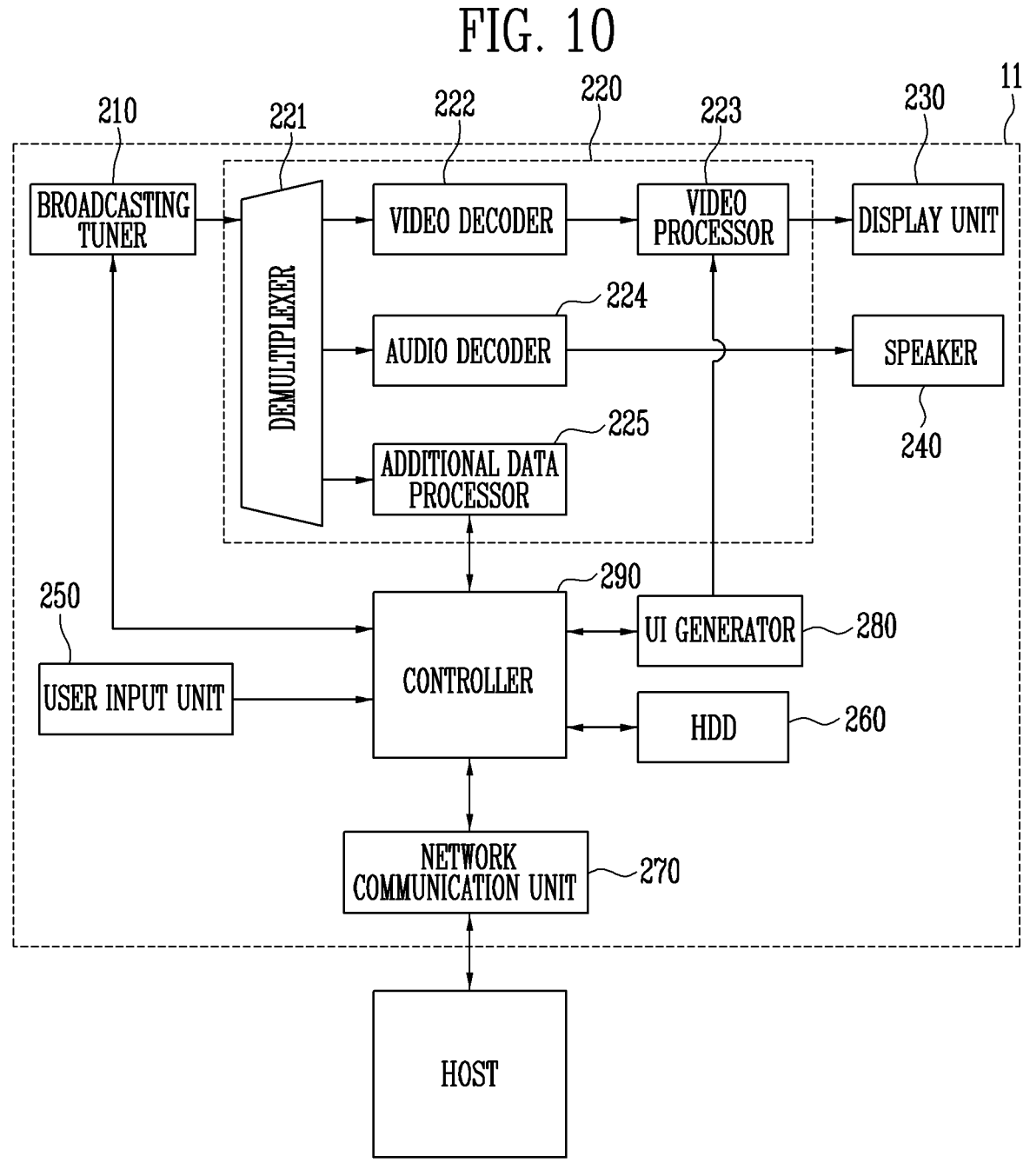
FIG. 10 is a schematic block diagram illustrating a tiled display device in accordance with an embodiment of the disclosure.

FIG. 10 is a schematic block diagram illustrating a tiled display device in accordance with an embodiment of the disclosure.

In FIG. 10, for convenience of description, the first display device 11 and a host system HOST are only illustrated.

Referring to FIG. 10, the tiled display device TLD in accordance with the embodiment of the disclosure may include the host system Host, a broadcasting tuning tuner 210, a signal processor 220, a display unit 230, a speaker 240, a user input unit 250, a hard disk drive (HDD) 260, a network communication unit 270, a user interface (UI) generator 280, and/or a controller 290.

The host system HOST may be implemented as at least one of a television system, a home theater system, a set-top box, a navigation system, a DVD player, a Blu-ray player, a personal computer (PC), a mobile phone system, and a tablet PC.

A command of a user may be input in various forms to the host system HOST. For example, a command according to a touch input of the user may be input to the host system HOST. In another embodiment, a command of the user according to a keyboard input or a button input of a remote controller may be input to the host system HOST.

The host system HOST may receive original video data corresponding to an original image, which is input from the outside. The host system HOST may divide the original video data into video data of which number corresponding to the number of display devices. For example, the host system HOST may divide original video data corresponding to the first display device 11, the second display device 12, the third display device 13, and the fourth display device 14 into first video data corresponding to a first image, second video data corresponding to a second image, third video data corresponding to a third image, and fourth video data corresponding to a fourth image. The host system HOST may transmit the first video data to the first display device 11, transmit the second video data to the second display device 12, transmit the third video data to the third display device 13, and transmit the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, the user may view an original image obtained by combining the first to fourth images displayed in the first to fourth display devices 11, 12, 13, and 14.

The first display device 11 may include a broadcasting tuner 210, a signal processor 220, a display unit 230, a speaker 240, a user input unit 250, an HDD 260, a network communication unit 270, a UI generator 280, and a controller 290.

The broadcasting tuner 210 may receive a broadcasting signal of a corresponding channel through an antenna by tuning a predetermined (or selectable) channel frequency under the control of the controller 290. The broadcasting tuner 210 may include a channel direction module and an RF demodulation module.

A broadcasting signal demodulated by the broadcasting tuner 210 may be processed by the signal processor 220 to be output to the display unit 230 and the speaker 240. The signal processor 220 may include a demultiplexer 221, a video decoder 222, a video processor 223, an audio decoder 224, and an additional data processor 225.

The demultiplexer 221 may separate the demodulated broadcasting signal into a video signal, an audio signal, and additional data. The video signal, the audio signal, and the additional data, which are separated, may be respectively recovered by the video decoder 222, the audio decoder 224, and the additional data processor 225. The video decoder 222, the audio decoder 224, and the additional data processor 225 may recover the video signal, the audio signal, and the additional data in a decoding format corresponding to an encoding format when a broadcasting signal is transmitted.

The decoded video signal may be converted by the video processor 223 to correspond to a vertical frequency, a resolution, a screen rate, and the like, which are suitable for output standards of the display unit 230, and the decoded audio signal may be output to the speaker 240.

The display unit 230 may include a display panel for display an image and a panel driver for controlling driving of the display panel.

The user input unit 250 may receive a signal transmitted from the host system HOST. The user input unit 250 may be provided to input not only data of selection of a channel transmitted from the host system HOST and selection and manipulation of an UI menu, but also data of a command that the user selects and inputs for communication with another display device.

The HDD 260 may be used to store various software programs including an OS program, recorded broadcasting programs, moving images, pictures, and other data, and may be configured as a storage medium such as a hard disk or a nonvolatile memory.

The network communication unit 270 may be used to perform near field communication with the host system HOST and another display device, and may be implemented as a communication module including an antenna pattern capable of implementing mobile communication, data communication, Bluetooth, RF, Ethernet, and the like.

The network communication unit 270 may transmit/receive a wireless signal of at least one of a base station, an external terminal, and a sever on a mobile communication network built in according to a technical standard or communication scheme for mobile communication (e.g., global system for mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTEA), 5G, and the like) through the antenna pattern which will be described.

The network communication unit 270 may transmit/receive a wireless signal in a communication network using wireless Internet technologies through the antenna pattern which will be described later. The wireless Internet technologies may include, for example, wireless LAN (WLAN), wireless-fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), and the like. The antenna pattern may transmit/receive data using at least one wireless Internet technology not listed above.

The UI generator 280 may generate a UI menu for communication with the host system HOST and another display device, and may be implemented by an algorithm code and an OSD IC. The UI menu for communication with the host system HOST and another display device may be a menu for designating a desired another digital TV and for selecting a desired function.

The controller 290 may be responsible for overall control of the first display device 11 and communication control of the host system HOST and the second to fourth display devices 12, 13, and 14. The controller 290 may be implemented by a micro control unit (MCU) in which a corresponding algorithm code for the control is stored and executed.

The controller 290 may control the network communication unit 270 to transmit a corresponding control command and corresponding data to the host system HOST and the second to fourth display devices 12, 13, and 14 according to an input and a selection of the user input unit 250. In case that a control command and data are input from the host system HOST and the second to fourth display devices 12, 13, and 14, an operation may be performed according to the corresponding control command.

A block diagram of the second display device 12, a block diagram of the third display device 13, and a block diagram of the fourth display device 14 are substantially identical to the block diagram of the first display device 11 described with reference to FIG. 10, and therefore, their descriptions will be omitted.

A method of manufacturing the above-described display device in accordance with an embodiment of the disclosure will be described.

FIGS. 11 to 18 are schematic cross-sectional views illustrating a method of manufacturing a display device in accordance with an embodiment of the disclosure. FIGS. 11 to 18 are schematic cross-sectional views illustrating a method of manufacturing the display device shown in FIGS. 1 and 10. For convenience of description, FIGS. 11 to 18 are simply illustrated, and detailed reference numerals are omitted.

Figure 11:
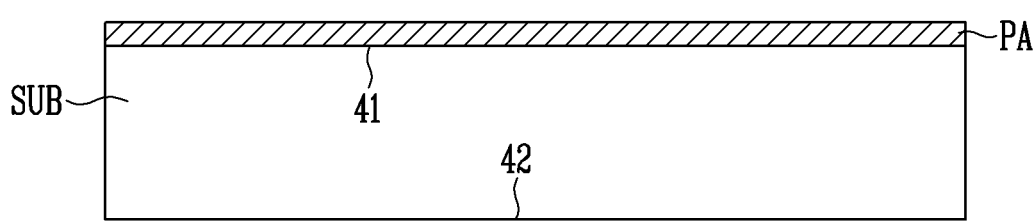
FIGS. 11 to 18 are schematic cross-sectional views illustrating a method of manufacturing a display device in accordance with an embodiment of the disclosure.
Figure 11:
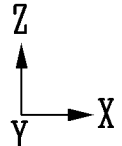

Referring to FIG. 11, a front pattern PA may be formed on a first surface 41 of a substrate SUB. The front pattern PA may include the thin film transistor layer TFTL and/or the light emitting element layer EML, as described above.

Figure 12:
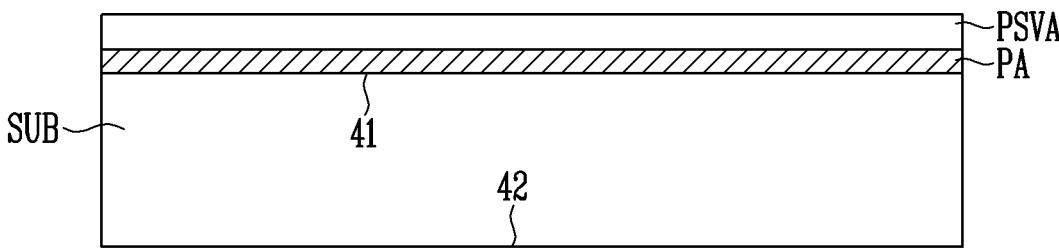
Figure 12:
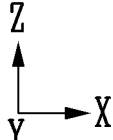

Referring to FIG. 12, a front protective layer PSVA may be formed on the front pattern PA. The front protective layer PSVA may include at least one of silicon nitride ($SiN_x$), silicon oxynitride ($SiO_xN_y$), silicon oxide ($SiO_x$), titanium oxide ($TiO_x$), and aluminum oxide ($AlO_x$), but the disclosure is not necessarily limited thereto.

Figure 13:
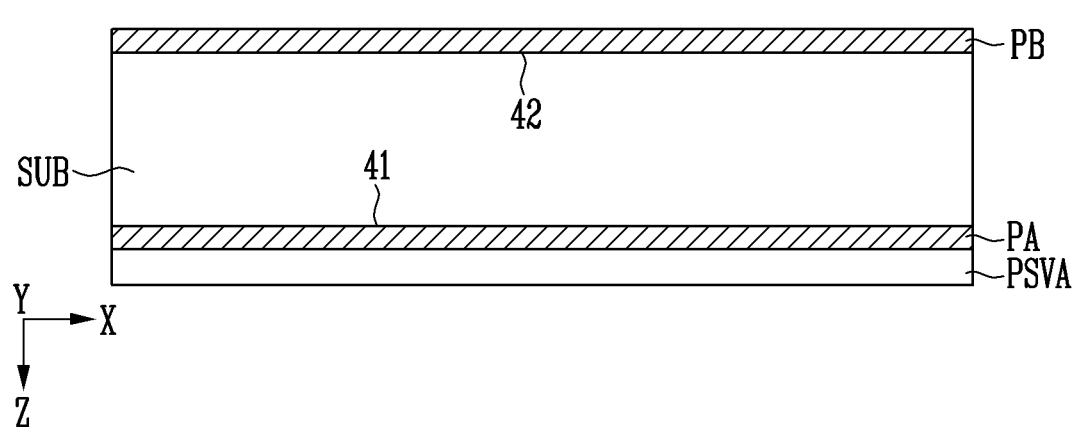

Referring to FIG. 13, the substrate SUB may be rotated, and a rear pattern PB may be formed on a second surface 42 of the substrate SUB. The rear pattern PB may include the connection electrode CCL and/or the via layer 170, as described above.

Figure 14:
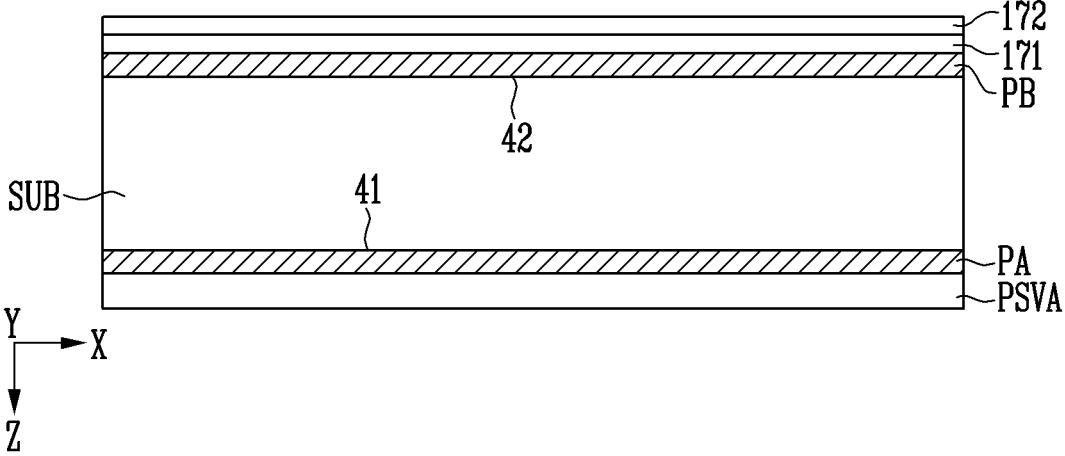

Referring to FIG. 14, a first protective layer 171 and a second protective layer 172 may be formed on the rear pattern PB. The first protective layer 171 may be directly formed on the rear pattern PB. The second protective layer 172 may be directly formed on the first protective layer 171.

The first protective layer 171 and the second protective layer 172 may be an inorganic layer. The first protective layer 171 and the second protective layer 172 may include different materials. For example, an oxygen (O) content of the second protective layer 172 may be greater than an oxygen (O) content of the first protective layer 171. Accordingly, a surface roughness of the second protective layer 172 may be greater than a surface roughness of the first protective layer 171. In an embodiment, the first protective layer 171 may include silicon nitride ($SiN_x$), and the second protective layer 172 may include silicon oxide ($SiO_x$) and/or silicon oxynitride ($SiO_xN_y$). However, the disclosure is not necessarily limited thereto, and the materials of the first protective layer 171 and the second protective layer 172 may be variously changed within a range in which the surface roughness of the second protective layer 172 may be increased by increasing the oxygen (O) content in the second protective layer 172.

In some embodiments, a thickness of the first protective layer 171 may be greater than a thickness of the second protective layer 172. For example, the thickness of the first protective layer 171 may be about 3000 Å, and the thickness of the second protective layer 172 may be in a range of about 100 Å to 3000 Å. However, the disclosure is not necessarily limited thereto.

Figure 15:
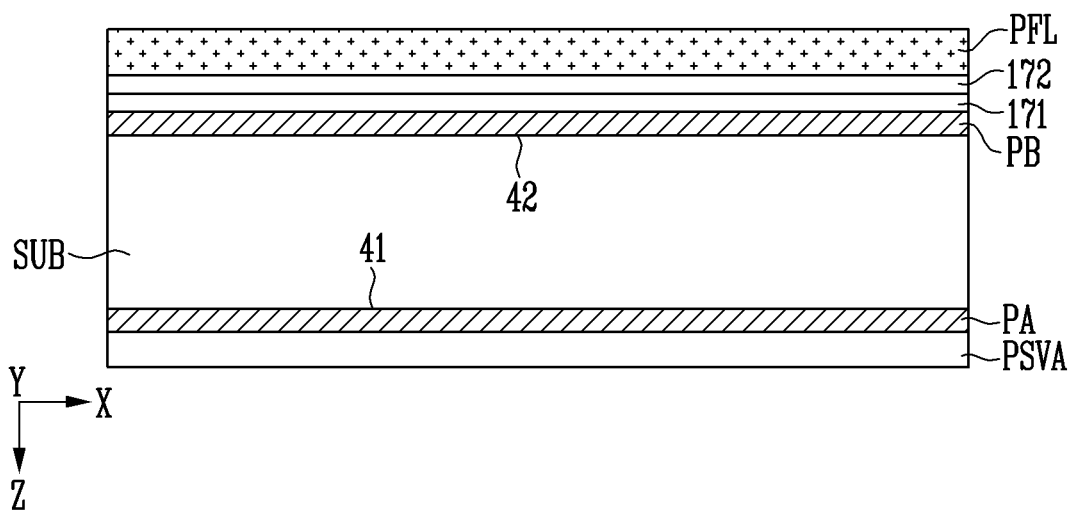
Figure 16:
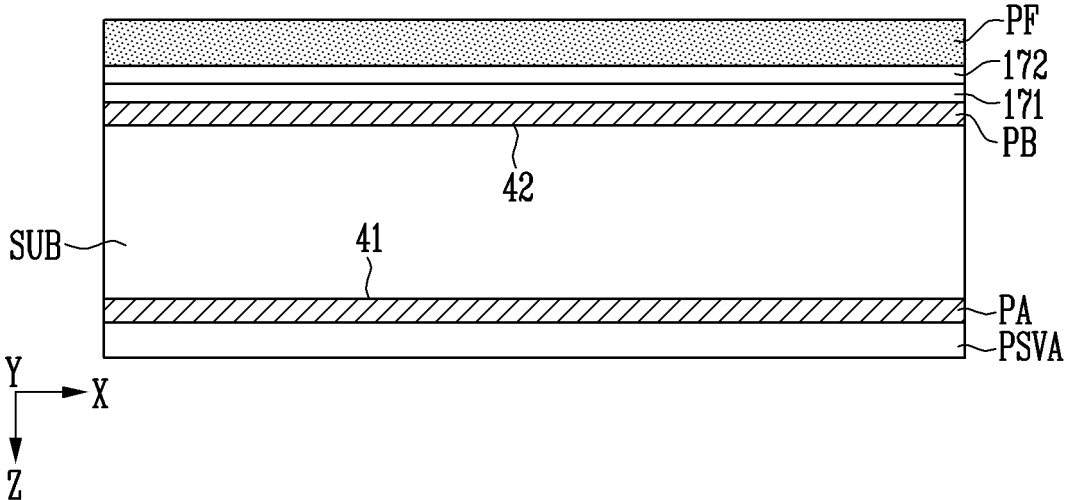

Referring to FIGS. 15 and 16, a protective film layer PFL may be formed on the second protective layer 172, and a protective film PF may be formed by curing the protective film layer PFL.

The protective film layer PFL may be formed in an ink form on a surface of the second protective layer 172 by an inkjet printing process, but the disclosure is not necessarily limited thereto. As described above, in case that the surface roughness of the second protective layer 172 on which the protective film layer PFL is formed is high, the spreadability of the protective film layer PFL may be improved, and thus a stain and a thickness distribution of the protective film PF may be reduced. Accordingly, a subsequent process may be stably performed, thereby improving processability.

Figure 17:
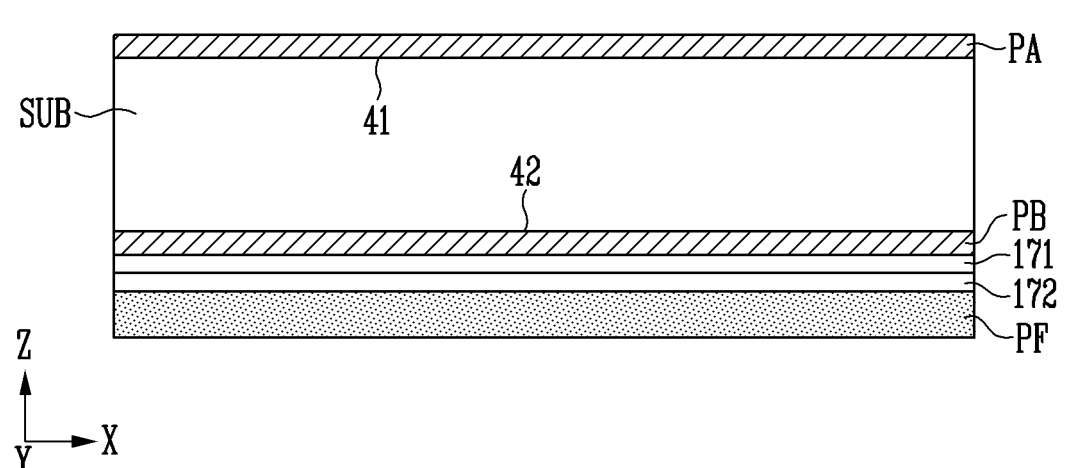
Figure 18:
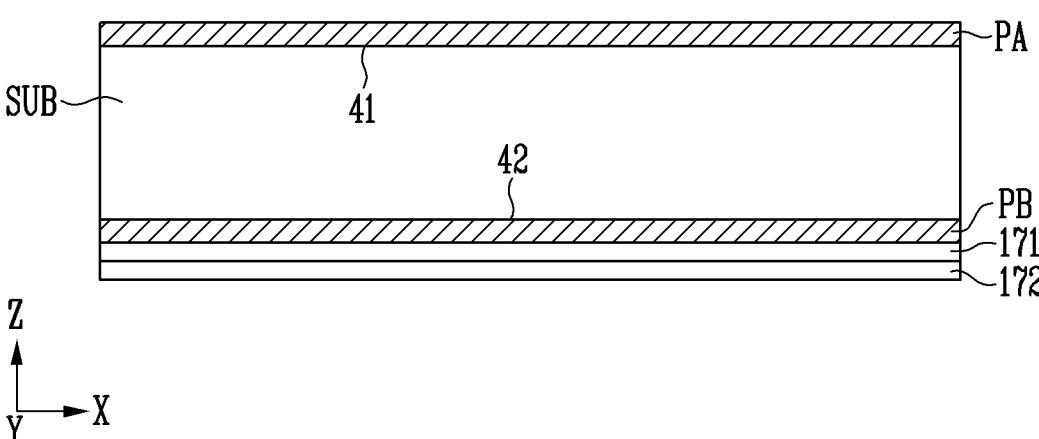

Referring to FIGS. 17 and 18, the substrate SUB may be rotated, and the front protective layer PSVA may be etched and removed. The protective film PF may be removed, thereby completing the display device shown in FIGS. 1 to 10.

In accordance with the above-described embodiment, the second protective layer 172 having a high surface roughness may be formed on the rear surface of the substrate SUB, to which the protective film PF is attached, so that the stain and the thickness distribution of the protective film PF may be reduced, thereby improving processability.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
light emitting elements disposed on a first surface of a substrate;
a connection electrode disposed on a second surface of the substrate;
a first protective layer disposed on the connection electrode; and
a second protective layer disposed on the first protective layer,
wherein an entirety of an outer surface of the first protective layer is in contact with the second protective layer, and
wherein a surface roughness of the second protective layer is greater than a surface roughness of the first protective layer.

2. The display device of claim 1, wherein an oxygen (O) content of the second protective layer is greater than an oxygen (O) content of the first protective layer.

3. The display device of claim 1, wherein the first protective layer includes silicon nitride ($SiN_x$).

4. The display device of claim 1, wherein the second protective layer includes silicon oxide ($SiO_x$).

5. The display device of claim 1, wherein the second protective layer includes silicon oxynitride ($SiO_xN_y$).

6. The display device of claim 1, wherein a thickness of the second protective layer is less than a thickness of the first protective layer.

7. The display device of claim 1, further comprising:
a via layer disposed between the connection electrode and the first protective layer.

8. The display device of claim 7, wherein a thickness of the via layer is greater than a thickness of the first protective layer.

9. The display device of claim 1, further comprising:
at least one transistor disposed on the first surface of the substrate.

10. The display device of claim 9, further comprising:
electrodes electrically connecting the at least one transistor and the light emitting elements to each other.

11. A method of manufacturing a display device, the method comprising:
forming a front pattern on a first surface of a substrate;
forming a rear pattern on a second surface of the substrate;
forming a first protective layer on the rear pattern, forming a second protective layer on the first protective layer; and
forming a protective film on the second protective layer, wherein an entirety of an outer surface of the first protective layer is in contact with the second protective layer, and wherein a surface roughness of the second protective layer is greater than a surface roughness of the first protective layer.

12. The method of claim 11, further comprising:

forming a front protective layer on the front pattern.

13. The method of claim 12, further comprising:

etching the front protective layer after the forming of the protective film.

14. The method of claim 13, further comprising:

removing an entirety of the protective film after the etching of the front protective layer.

15. The method of claim 11, further comprising:

forming a protective film layer on the second protective layer, wherein the forming of the protective film includes curing the protective film layer.

16. The method of claim 15, wherein the protective film layer is formed by an inkjet printing.

17. The method of claim 11, wherein the second protective layer is thinner than the first protective layer.

18. The method of claim 11, wherein the first protective layer includes silicon nitride ($SiN_x$).

19. The method of claim 11, wherein the second protective layer includes silicon oxide ($SiO_x$).

20. The method of claim 11, wherein the second protective layer includes silicon oxynitride ($SiO_xN_y$).

* * * * *